United States Patent [19]
Greiff et al.

[11] Patent Number: 5,929,515
[45] Date of Patent: Jul. 27, 1999

[54] GETTERING ENCLOSURE FOR A SEMICONDUCTOR DEVICE

[75] Inventors: Paul Greiff, Wayland; Paul Brezinski, Raynham, both of Mass.

[73] Assignee: The Charles Stark Draper Laboratory, Inc., Cambridge, Mass.

[21] Appl. No.: 08/941,823

[22] Filed: Oct. 1, 1997

[51] Int. Cl.⁶ ................................................. H01L 23/20
[52] U.S. Cl. ............................ 257/682; 257/798; 257/81
[58] Field of Search ............................ 257/678, 682, 257/687, 798, 680, 81, 82, 99, 100

[56] References Cited

U.S. PATENT DOCUMENTS

| | | | |
|---|---|---|---|
| 4,186,980 | 2/1980 | Wolski | 316/19 |
| 4,260,425 | 4/1981 | Ulrich et al. | 134/2 |
| 4,352,119 | 9/1982 | Bardens et al. | 257/682 |
| 4,426,769 | 1/1984 | Grabbe | 257/682 |
| 4,548,258 | 10/1985 | Nelson et al. | 165/1 |
| 4,630,095 | 12/1986 | Otsuka et al. | 357/78 |
| 4,882,518 | 11/1989 | Cherry | 313/512 |
| 5,145,437 | 9/1992 | Ondra et al. | 445/45 |
| 5,214,346 | 5/1993 | Komatsu | 313/309 |
| 5,397,897 | 3/1995 | Komatsu et al. | 250/338.4 |
| 5,399,805 | 3/1995 | Tyler et al. | 257/682 |
| 5,491,361 | 2/1996 | Stupian et al. | 257/682 |
| 5,521,123 | 5/1996 | Komatsu et al. | 437/209 |
| 5,594,296 | 1/1997 | Mitsutake et al. | 313/309 |
| 5,610,438 | 3/1997 | Wallace et al. | 257/682 |

Primary Examiner—Carl Whitehead, Jr.
Attorney, Agent, or Firm—Weingarten, Schurgin, Gagnebin & Hayes LLP

[57] ABSTRACT

Gettering enclosures for semiconductor packages, comprising an enclosure having a cavity for accommodating a semiconductor device; a gettering chamber (disposed above the semiconductor device) communicating with the cavity, comprising a getter precursor secured to the cavity and spaced from a wall of the cavity, wherein the wall is transparent to laser light so as to allow a beam of laser light to strike the getter precursor and sputter same on the walls of the gettering chamber.

9 Claims, 1 Drawing Sheet

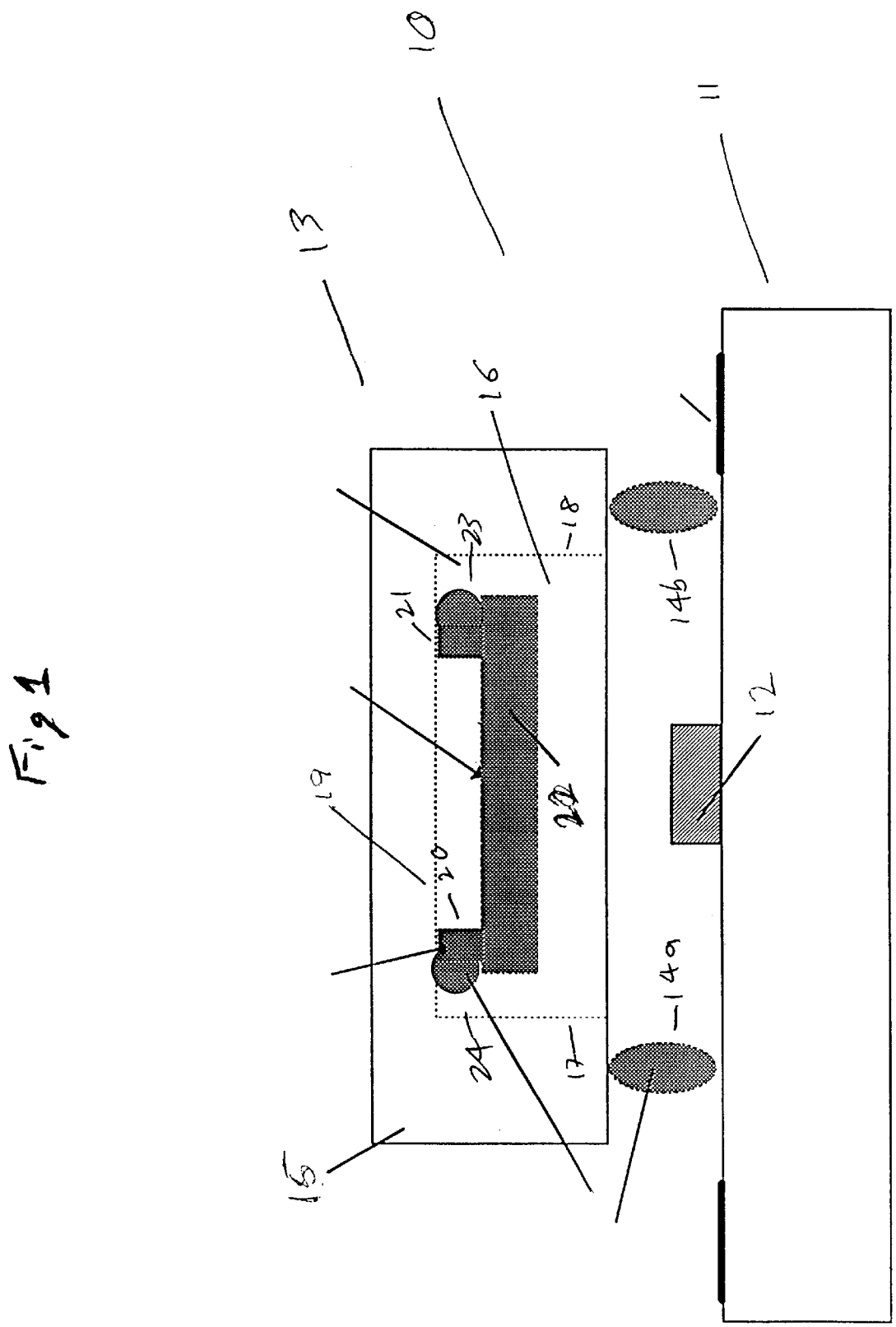

GETTERING ENCLOSURE FOR A SEMICONDUCTOR DEVICE

CROSS REFERENCE TO RELATED APPLICATIONS n/a

STATEMENT REGARDING FEDERALLY SPONSORED RESEARCH OR DEVELOPMENT n/a

FIELD OF THE INVENTION

This invention relates to semiconductor packaging, in particular to semiconductor packaging comprising a gettering chamber.

BACKGROUND OF THE INVENTION

In the production of electronics employing devices such as semiconductors, accelerometers, and gyroscopes, it is known to enclose the device in an enclosure for protecting the device from the elements. Sealing enclosures made from, e.g., ceramic, glass or plastic have been used. While the enclosure protects the device from external elements, oftentimes during the operation of the electronics, the enclosed device (as well as, in some cases, the walls of the enclosure) emits gases which can contribute to the malfunction of the device. As such, it is known to incorporate a gettering material in the enclosure to absorb or react with the gas generated in the package and obviate the problem. Getter is available in a very effective form as a sintered coating of fine particles on a metal foil which may be affixed to the inside of the enclosure.

There are practical problems in the art, however, with making such getter equipped on-chip enclosures. For the enclosure to be effective in most applications, the space in the enclosure above the chip has to be evacuated before sealing. While attainable, in practice this is not always easy. As such, improvements in the process and technology of evacuating the getter containing enclosure, sealing it to the substrate containing the device, and ensuring that the getter is properly activated, are always being sought.

SUMMARY OF THE INVENTION

The invention relates to gettering enclosures for semiconductor packages, comprising a) an enclosure having a cavity for accommodating a semiconductor device; b) a gettering chamber (disposed above the semiconductor device) communicating with the cavity, comprising a getter precursor secured to the cavity and spaced from a wall of the cavity, wherein the wall is transparent to laser light so as to allow a beam of laser light to strike the getter precursor and sputter same on the walls of the gettering chamber. Alternatively the laser may be used to heat the getter to its activation temperature.

DESCRIPTION OF THE DRAWINGS

FIG. 1 is a simplified cross-sectional exploded view of one embodiment of the invention.

DETAILED DESCRIPTION OF THE INVENTION

One exemplary embodiment of the invention is shown in very simplified form in FIG. 1. On-chip enclosure 10 includes instrument substrate 11, device 12, e.g., semiconductor, accelerometer, or gyroscope, and enclosure 13. Enclosure 13 is hermetically sealed to substrate 12 via beads of solder glass 14a and 14b, whereas the space above is evacuated, say, to 1 mTorr. Enclosure 13 includes cap 15 including cavity 16 having side walls 17 and 18, and transparent (to, e.g., laser radiation) wall 19. Mounted to wall 19 and spaced therefrom by spacer feet 20 and 21, is getter material 22, such as solid foils of getter elements such as Ti, V, Cr or sintered powder commercial getter foils, which is secured to wall 19 via beads of solder glass 23 and 24.

The cap may be a slab of borosilicate glass, e.g., Pyrex®, which is secured to the substrate by a "frame" of solder glass around the perimeter of the bottom of the cap. Solder glass, which fuses at about 450° C., may be advantageously applied by silk screening of a glass paste or other convenient means. Of course, other means of securing the cap by mechanical or chemical means may be used, but by using the same process which forms the solder glass bead to coat the bottom of the cavity the number of processing steps required to incorporate the getter is minimized.

The invention is advantageous in that the getter is securely held in place without requiring additional area, and a low cost activation and assembly process is provided.

In order to achieve higher activation of the getter to attain a greater vacuum within the enclosure, the present invention provides for spacing of the getter from the wall to which it is attached. This can be done by, for example, stamping dimpled feet into the getter as shown in FIG. 1, or curving the getter in one or even two dimensions. Furthermore, one or more of the walls of the enclosure are desirably transparent to allow laser ablation of the getter onto the inner walls of the cap. Benefits of this embodiment include minimization of particle fallout onto the device due to the getter material catching such particles. Sputtering from the face of the getter facing the cap by laser ablation is a very compact and economical way of doing this, without taking up a lot of space inside the cap; and allows easier selective heating of the getter to improve activation.

Other embodiments and variations of the disclosed invention will be apparent to those of ordinary skill in the art without departing from the inventive concepts contained herein. Accordingly, this invention is to be viewed as embracing each and every novel feature and novel combination of features present in or possessed by the invention disclosed herein and is to be viewed as limited solely by the scope and spirit of the appended claims.

What is claimed is:

1. A gettering enclosure for a semiconductor device, comprising:

a substrate;

an enclosure hermetically sealed to the substrate, the enclosure comprising at least one wall and defining a cavity therein disposed to enclose a semiconductor device mounted to the substrate, at least a portion of the wall comprising a material transparent to laser radiation;

a getter precursor material secured to the wall, at least a portion of the getter precursor material spaced from the transparent material and disposed in relation to the transparent material to allow a beam of laser radiation to pass through the transparent material to strike the getter precursor material.

2. The gettering enclosure of claim 1, wherein the wall is formed of a borosilicate glass.

3. The gettering enclosure of claim 1, wherein the enclosure is hermetically sealed to the substrate by one or more beads of solder glass.

4. The gettering enclosure of claim 1, further comprising a vacuum in the cavity.

5. The gettering enclosure of claim 4, wherein the cavity is evacuated to a pressure of 1 mTorr.

6. The gettering enclosure of claim 1, wherein the getter precursor material is spaced from the transparent material by one or more feet.

7. The gettering enclosure of claim 1, wherein the getter precursor material is secured to the wall by one or more beads of solder glass.

8. The gettering enclosure of claim 1, wherein the getter precursor material comprises a solid foil of getter elements comprising Ti, V, or Cr.

9. The gettering enclosure of claim 1, wherein the getter precursor material comprises a sintered powder getter foil.

* * * * *